(12) United States Patent
Cheung

(10) Patent No.: US 6,853,596 B2
(45) Date of Patent: Feb. 8, 2005

(54) SEMICONDUCTOR MEMORY ENABLING CORRECT SUBSTITUTION OF REDUNDANT CELL ARRAY

(75) Inventor: Andy Cheung, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/658,428

(22) Filed: Sep. 10, 2003

(65) Prior Publication Data

US 2004/0100833 A1 May 27, 2004

(30) Foreign Application Priority Data

Sep. 13, 2002 (JP) ........................................ 2002-267680

(51) Int. Cl.$^7$ ................................................ G11C 7/00
(52) U.S. Cl. .............. 365/200; 365/230.03; 365/189.07
(58) Field of Search ........................... 365/200, 230.03, 365/189.07, 230.02, 238.5

(56) References Cited

U.S. PATENT DOCUMENTS 5,737,269 A     4/1998   Fujita ........................ 365/200
5,978,304 A  *  11/1999  Crafts ..................... 365/230.03

* cited by examiner

Primary Examiner—David Lam
(74) Attorney, Agent, or Firm—Arent Fox PLLC

(57) ABSTRACT

A semiconductor memory includes a core array including a plurality of memory cells, and a redundant array to be substituted for a substitution object area having a defective cell in the core array. In this semiconductor memory, there are provided a substitution address memory which stores an address of a first substitution object area including both sides of the defective cell as a substitution object address, and a redundancy controller which controls to substitute the redundant array for the substitution object area of the core array. When a portion of the first substitution object area is located on the outside of the core array, the redundancy controller controls to substitute the redundant array for a second substitution object area which has the defective cell and is located on the inside of the core array.

13 Claims, 13 Drawing Sheets

SEMICONDUCTOR MEMORY ENABLING CORRECT SUBSTITUTION OF REDUNDANT CELL ARRAY

CROSS-REFERENCE TO RELATED APPLICATIONS

This application is based upon and claims the benefit of priority from the prior Japanese Patent Application No. 2002-267680, filed on Sep. 13, 2002, the entire contents of which are incorporated herein by reference.

FIELD OF THE INVENTION

The present invention relates to a semiconductor memory having a redundant cell array and more particularly a semiconductor memory in which the redundant cell array is correctly substituted for a defective cell area in a core array.

BACKGROUND OF THE INVENTION

As the semiconductor memory has become larger in scale with micro-fabrication technology, a defective cell may exist in a core array with an increased possibility. A defect in the memory cell itself may cause such a defective cell, as well as a short circuit between neighboring bit lines may constitute one of other major causes. Such a defective cell is normally detected in the test process before the shipment, and the detected defective cell area is replaced by a redundant cell array for relieving the core array. The substitution method which has most popularly been applied hereto is to replace a block of a predetermined size in the core array by a redundant cell array of the same predetermined size. According to this conventional method, a core array is divided into a plurality of predetermined blocks in a fixed manner. A block address for a block having the detected defective cell is stored in a defective cell information storage area, and thus the redundant cell array is substituted. When there is an access from the outside, the redundant cell array is selected in place of the block corresponding to the address stored in this defective cell information storage area.

FIG. 1 shows a diagram illustrating the conventional redundant configuration of a flash memory, an example of the semiconductor memory. In this memory, there is provided a redundant cell array RA, which is located neighboring to a core array COA. The core array COA is constituted of, as an example, sixteen (16) I/O blocks I/O0–15, and a reference cell array RefA disposed in a neighboring position. An address A (23:0) supplied at the time of access is input to an address buffer ADD-Buf, and divided into a row address A (23:7) and a column address A (6:0) which are further supplied to an X decoder XDEC and a Y decoder YDEC respectively. The column address A (6:0) is also supplied to a Y decoder YDECR of the redundant cell array RA. In the above-mentioned memory, each I/O block includes a plurality of bit lines BL, 64 memory cells MC disposed between the neighboring bit lines, and a plurality of word lines WL. Each I/O block can store 128-bit data for one word line WL.

In the example shown in FIG. 1, the redundant cell array RA is of the same size as each I/O block in the core array. The I/O block I/O12 which includes a defective cell is replaced by the redundant cell array RA. Here, the redundant cell array RA is not necessarily of the same size as each I/O block. When the RA is smaller in size than the I/O block, a portion of the I/O block area is replaced by the redundant cell array RA.

The flash memory shown in FIG. 1 is a nonvolatile memory in which each memory cell has a trap gate. Depending on whether or not charge is stored in both sides of the trap gate, the transistor threshold voltage of the memory cell becomes different. Stored data are read out making use of this difference. For example, when the bit located on the left side of a memory cell MC0 is to be read out, a word line WL is set to a predetermined voltage, and a bit line BL0 is grounded. Whether or not a cell current is generated in the memory cell is detected through a bit line BL1. At this time, in order to eliminate an influence of the memory cell MC1 connected on the same bit line BL1 but positioned on the opposite side, a bit line BL2 is driven to a pre-charge level. On the other hand, when the bit located on the right side of the memory cell MC0 is to be read out, the control is carried out based on the bit line relation with left and right reversed. These kind of memory cell array structure is called a virtual bit line structure, in which one of the bit line functions as a read bit line.

The memory cell shown in FIG. 1 is in distribution in the market as a commercial product. However, the inventors of the present invention have no knowledge of either patent document or non-patent document concretely disclosing arts of the aforementioned memory cell. The following patent document disclosed is known as a redundant configuration of a synchronous dynamic random access memory (DRAM).

[Patent Document]

An official gazette of the Japanese unexamined patent, publication number Hei-8-102186. (Date of publication: 16th of Apr., 1996)

One feature of the virtual bit line configuration is that a predetermined defective cell area centering the defective cell is replaced by the redundant cell array. For example, in FIG. 1, when there is a defect in the memory cell MC0 located in the boundary area of an I/O block, or when there is a short circuit between the bit lines BL0 and BL1, it is not possible to relieve from the defect if only the I/O block concerned is simply replaced by the redundant cell array RA. The reason is, because one bit line depends on the state of a memory cell pair connected to the bit line concerned, it is necessary to eliminate the influence of the memory cell operation connected to the bit line by properly controlling the potential of the non-illustrated neighboring bit line to the left side of the bit line BL0 when reading the cell current of the memory cell MC0 via the bit line BL0. Therefore, it is necessary to arrange the substitution object area of the core array so that the defective cell does not exist at the boundary of the substitution object area.

To cope with this problem, there has been proposed to set the substitution object area by means of a "moving window" scheme. According to this scheme, an area centering the detected defective cell is set as a substitution object area each time, instead of fixedly determining in advance the substitution object area of the core array. In other words, the substitution object area is moved depending on defective cell locations. More specifically, the address of an area centering the detected defective cell is recorded in the defective cell information storage area, and the redundant cell array is selected to substitute for the recorded address area.

According to such a moving window scheme, when a defective cell is detected in the test process, information of the predetermined area which centers the defective cell, for example the top address of the area concerned, is written into the defective cell information storage area. Accordingly, in case the defective cell is located on the boundary of a memory block, the both sides of the memory block boundary in the core array is set as the substitution object area. In this case, depending on the access address, it is necessary to check which of the memory block output located on either side of the boundary is to be replaced by the redundant cell array output. In addition, as another problem to be solved, when the defective cell is located in the edge portion of the core array, the both sides of the boundary edge portion of the core array are to be set as the substitution object area. However, in this case, because there is no memory block outside the boundary of the edge portion of the core array, it is not possible to use the same substitution check function as is applicable for the case of the defective cell being located on the boundary of the memory block of the core array.

Such a problem related to the edge boundary of the cell array also arises when the reference array is provided in the neighboring location to the core array. In the reference array, there is disposed a reference cell which is selected simultaneously when the memory cell in the core array is selected at the time of readout or verification. Accordingly, the same problem as the above arises when the defective cell is located near the boundary of the core array and the reference array, because the substitution object area includes the reference array outside the core array in this case.

SUMMARY OF THE INVENTION

Accordingly, in a semiconductor memory which substitutes a redundant cell array for an area including a defective cell, it is an object of the present invention to provide the semiconductor memory capable of correctly substituting the redundant cell array irrespective of the defective cell location.

In order to attain the above-mentioned object, according to a first aspect of the present invention, a semiconductor memory includes a core array including a plurality of memory cells, and a redundant array to be substituted for a substitution object area having a defective cell in the core array. In this semiconductor memory, there are provided a substitution address memory which stores an address of a first substitution object area including both sides of the defective cell as a substitution object address, and a redundancy controller which controls to substitute the redundant array for the substitution object area of the core array. When the first substitution object area is entirely located on the inside of the core array, the redundancy controller controls to substitute the redundant array for the first substitution object area corresponding to the substitution object address. Meanwhile, when a portion of the first substitution object area is located on the outside of the core array, the redundancy controller controls to substitute the redundant array for a second substitution object area which has the defective cell and is located on the inside of the core array.

According to the above-mentioned first aspect of the present invention, in the memory test process, the address of the first substitution object area which includes both sides of the detected defective cell is stored in the substitution address memory. When the defective cell is located in the edge portion of the core array, there arises an inconvenience that a portion of the first substitution object area is located on the outside of the core array. To avoid this inconvenience, the redundancy controller automatically controls to substitute the redundant array for a second substitution object area which includes the defective cell but does not include the outside area of the core array, in place of the first substitution object area. Thus, it becomes possible in the test process to obtain the substitution object address to be stored in the substitution address memory uniformly by use of an identical logic operation, irrespective of the defective cell location. Thus, a simplified test process as well as a reduced production cost can be attained. The redundancy controller can eliminate the aforementioned inconvenience produced in the test process.

According to a second aspect of the present invention to attain the aforementioned object, in the semiconductor memory having both a core array including a plurality of blocks each having a plurality of memory cells and a redundant array to be substituted for a substitution object area including a defective cell in the core array, there are provided a substitution address memory which stores an address of a first substitution object area including both sides of the defective cell as a substitution object address, and a redundancy controller which controls to substitute the redundant array for the core array. When the first substitution object area is entirely located on the inside of the core array and extends to both neighboring blocks, the redundancy controller controls to substitute the redundant array for either one of the neighboring blocks, depending on the access address. Meanwhile, when a portion of the first substitution object area is located on the outside of the core array, the redundancy controller controls to substitute the redundant array for a second substitution object area which has the defective cell and is located on the inside of the core array.

According to one embodiment of the above-mentioned second aspect of the present invention, the redundant array is of the same size as each block. The substitution object address includes a block address and an in-block address of the block indicative of the first substitution object area. The redundancy controller selects either one of the neighboring blocks by comparing the access address with the in-block address.

According to another embodiment in the above-mentioned second aspect of the present invention, each block in the core array further has a plurality of sub-blocks, and the redundant array is of the same size as each sub-block. The substitution object address includes a block address and a sub-block address indicative of the first substitution object area, and an address in the sub-block of the block also indicative of the first substitution object area. The redundancy controller selects either one of the neighboring blocks by comparing the access address with the address in the sub-block.

Further, in the above embodiment, when the first substitution object area extends to the neighboring sub-blocks, the redundancy controller selects either one of the neighboring sub-blocks depending on the access address, and controls to substitute the redundant array for the selected sub-block. Accordingly, when the first substitution object area extends to the neighboring blocks in addition to the neighboring sub-blocks, the redundancy controller substitutes the redundant array by selecting either one of the neighboring sub-blocks and either one of the neighboring blocks.

Further scopes and features of the present invention will become more apparent by the following description of the embodiments with the accompanied drawings.

DETAILED DESCRIPTION OF THE PREFERRED EMBODIMENTS

The preferred embodiment of the present invention is described herein after referring to the charts and drawings. However, it is to be noted that the scope of the present invention is not limited to the embodiments described below, but instead embraces the invention and all equivalents to the claims described.

In the embodiment described below, a flash memory is taken as an example of the semiconductor memory. The flash memory includes a cell transistor with a trap gate the threshold voltage of which differs depending on whether charge is injected in the trap gate.

Figure 1:
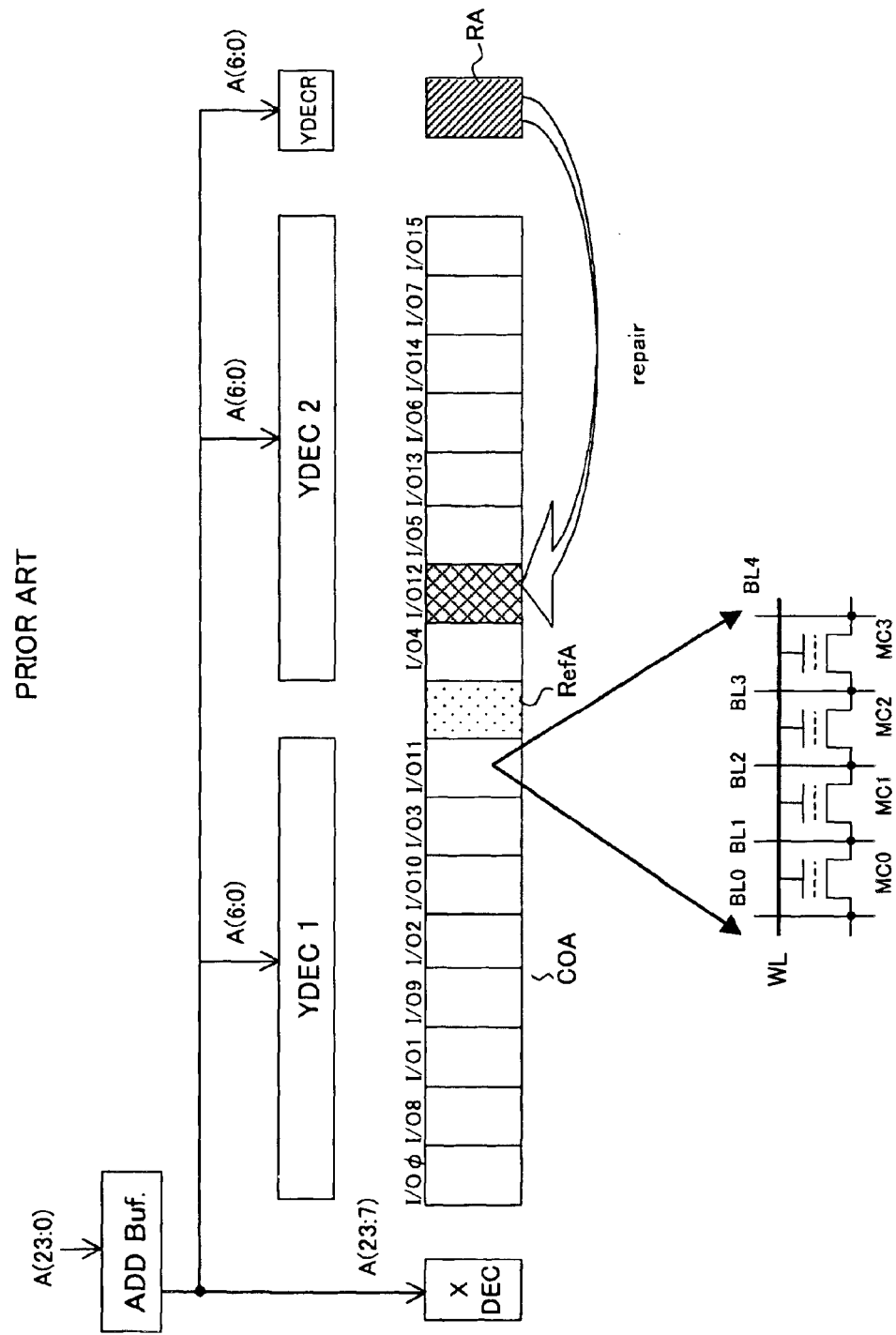
FIG. 1 shows a conventional redundant configuration of a flash memory as an example of a semiconductor memory.

An overall configuration of the semiconductor memory in accordance with the embodiment of the present invention includes a substitution address memory which stores an address of a first substitution object area including both sides of a defective cell as a substitution object address, and a redundancy controller which controls to substitute the redundant cell array output for the core array output, in addition to the configuration shown in FIG. 1. These configurations are described later in detail.

Figure 2:
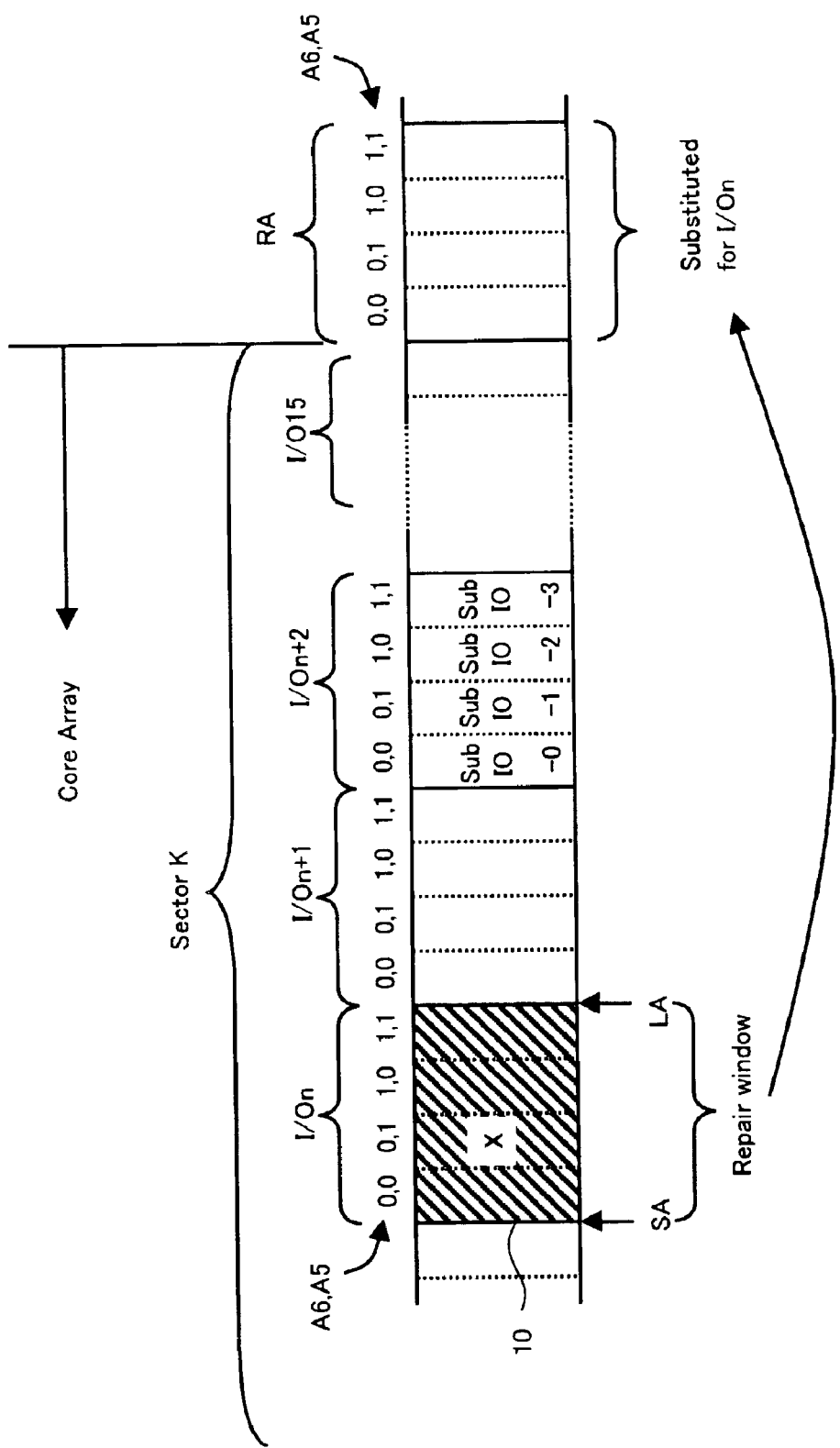
FIG. 2 shows a diagram illustrating the substitution principle of a redundant cell array for a substitution object area in accordance with one embodiment of the present invention.
Figure 3:
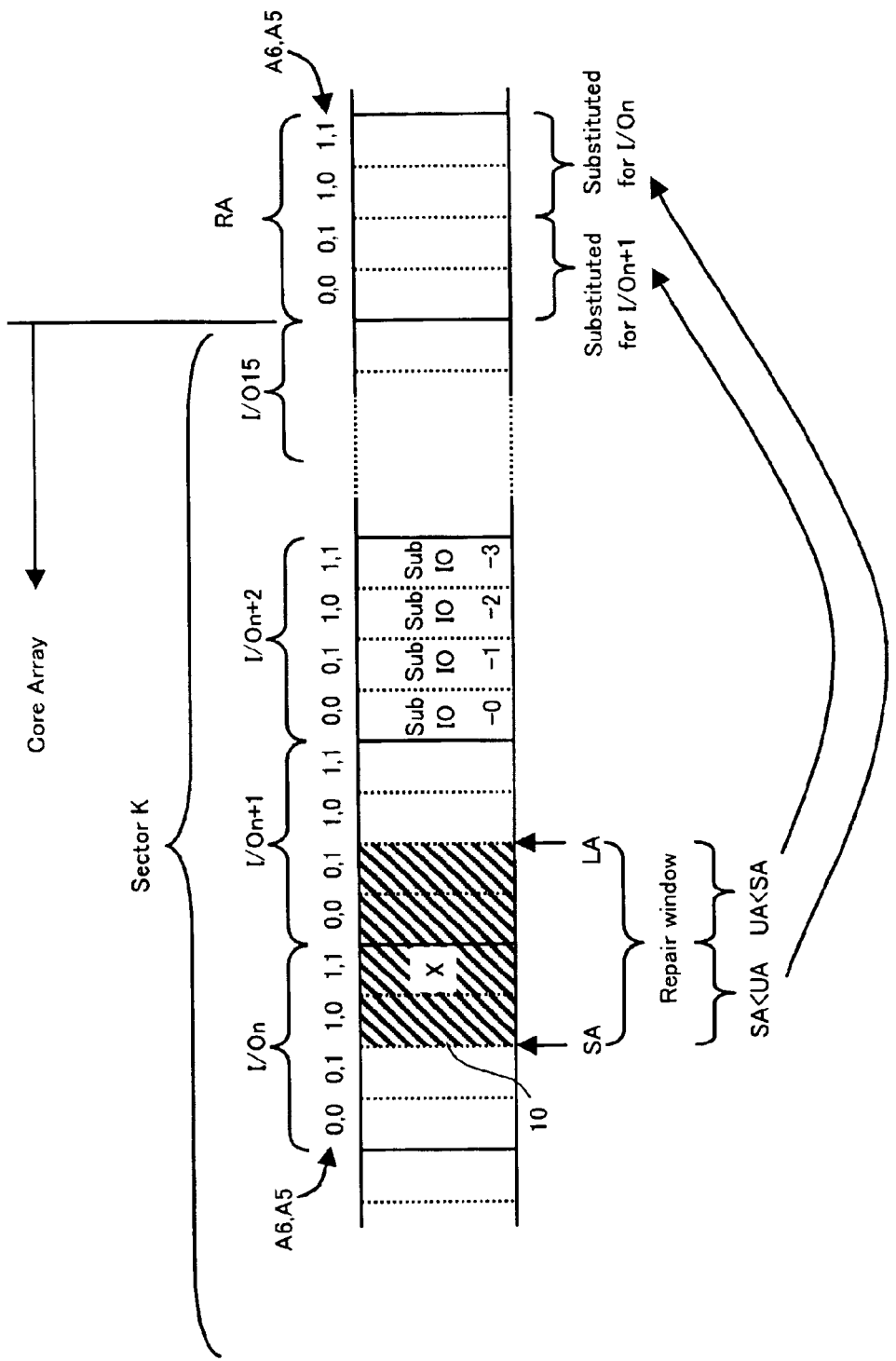
FIG. 3 shows a diagram illustrating the substitution principle of the redundant cell array for the substitution object area in accordance with the embodiment of the present invention.
Figure 4:
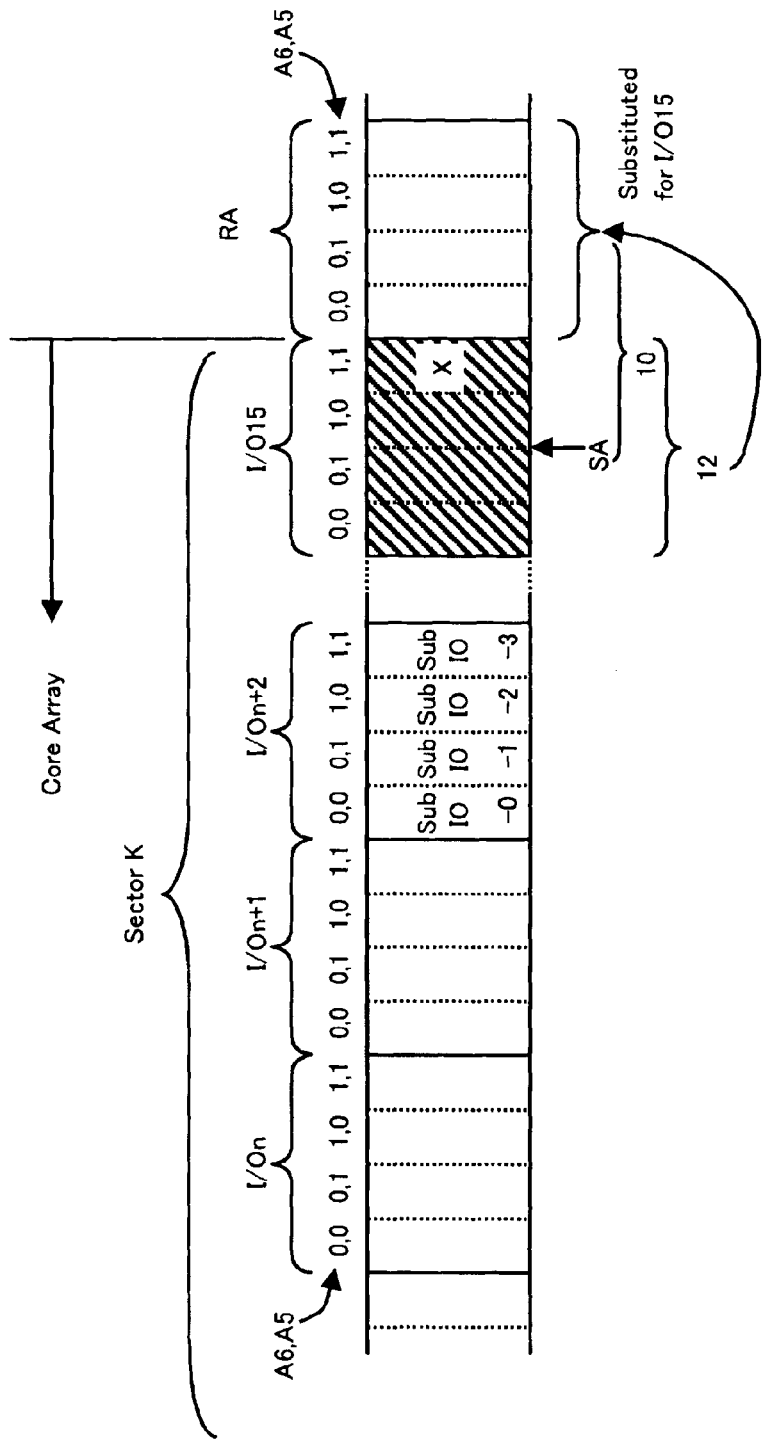
FIG. 4 shows a diagram illustrating the substitution principle of the redundant cell array for the substitution object area in accordance with the embodiment of the present invention.

FIGS. 2, 3 and 4 show diagrams illustrating the substitution principle of the redundant cell array for the substitution object area. In FIG. 2, a core array provides a plurality of sectors each constituting a unit of erasure. Each sector also provides a plurality of I/O blocks. The core array COA shown in FIG. 1 illustrates a configuration example constituted of only one sector. This sector includes sixteen (16) I/O blocks, I/O0–I/O15, and a single reference array RefA. In FIG. 2, I/O blocks I/On, I/On+1, I/On+2 and I/O15 included in a sector K are depicted among these 16 blocks. Each I/O block is virtually divided into four sub-blocks, Sub-IO-0 to sub-IO-3, each having sub-block address (A6, A5) as depicted in the figure. The redundant array RA is of the same size as each I/O block, and is also divided into four sub-blocks.

In the example shown in FIG. 2, the defective cell marked with 'x' exists in the area of a sub-block (0, 1) of the I/O block I/On in the sector K. In this case, the start address SA of substitution object area 10 to be replaced by the redundant array RA is (A6, A5=0, 0), and the end address LA thereof is (A6, A5=1, 1). This substitution object area 10 which is sandwiched between the start address SA and the end address LA is defined as a 'repair window', which is to be replaced by the redundant array RA. This substitution object area 10 is set in such a way as to include the areas located on both sides of the defective cell, and is replaced so as not to impede the read operation or the program operation under the virtual bit line configuration. Therefore, the address of substitution object area 10 includes both the address of the I/On block and the sub-block address in this block. These information sets are recorded in a non-illustrated substitution address memory as the start address SA of the substitution object area 10.

As described above, when the start address SA of substitution object area 10 is I/On and (A6, A5=0, 0), the entire area of the I/O block I/On is collectively replaced by the redundant array RA. Accordingly, the output from I/O block I/On is entirely replaced by the output of the redundant array RA. In other words, according to the I/O block address n included in the substitution object address, the non-illustrated redundancy controller controls to substitute the redundant array RA for the substitution object area.

In the example shown in FIG. 3, a defective cell marked with 'x' exists in the area of the sub-block (1, 1) of the I/O block I/On in the sector K. In this case, the start address SA of substitution object area 10 to be replaced by the redundant array RA is (A6, A5=1, 0) and the end address LA thereof is (A6, A5=0, 1). This substitution object area 10 which is sandwiched between the start address SA and the end address LA is the repair window to be replaced by the redundant array RA. This substitution object area 10 is set in such a way as to include the areas located on both sides of the defective cell. As a result, substitution object area 10 extends to both neighboring I/O blocks I/On and I/On+1.

As described above, when substitution object area 10 extends to both sides of the I/O block boundary, it is necessary that the upper-level sub-blocks (1, 0) and (1, 1) of the redundant array RA be substituted for the upper-level sub-blocks (1, 0) and (1, 1) of the I/O block I/On, and also the lower-level sub-blocks (0, 0) and (0, 1) of the redundant array RA be substituted for the lower-level sub-blocks (0, 0) and (0, 1) of the I/O block I/On+1. Accordingly, an access address (or user address) UA is compared with the in-block address (A6, A5=1, 0) of the start address, and depending on the result of this comparison, either the I/O block I/On or the I/O block I/On+1 is selected for being replaced by the redundant array RA. As shown in FIG. 3, if the access address UA is no smaller than the in-block address of the start address SA (SA=<UA), the output of the redundant array RA is substituted for the output of the I/O block I/On. Meanwhile, if the access address UA is smaller than the in-block address of the start address SA (UA<SA), the output of the redundant array RA is substituted for the output of the I/O block I/On+1. In order to distinguish between the above-mentioned two cases, the non-illustrated redundancy controller compares the access address UA with the in-block address of the start address SA, selects either one of the neighboring I/O blocks, and substitutes the output of the redundant array RA for the selected I/O block output. More specifically, the redundancy controller increments the I/O block address n of the substitution object address to n+1 when UA<SA.

In the example shown in FIG. 4, the defective cell marked with 'x' exists in the sub-block area (1, 1) of the uppermost I/O block I/O15 in the sector K. In this case, the start address SA of the substitution object area to be replaced by the redundant array RA equals to I/O15 and (A6, A5=1, 0), and the end address LA (not shown) equals to I/O16 and (A6, A5=0, 1). However, in this case, the area 10 sandwiched between the start address SA and the end address LA inevitably includes the outside area of the uppermost end portion of the core array. When a defective cell is detected in the test process as being located in the sub-block (1, 1) of the I/O block I/O15, the start address SA is automatically set to I/O15 and (A6, A5=1, 0). This is caused by a uniform logic of determining the start address without taking the defective cell location into consideration.

As can be understood, when substitution object area 10 beginning from the start address SA extends to the outside of the core array, it becomes unable to perform correct substitution of the redundant array RA having been illustrated in FIGS. 2 and 3. Therefore, according to the embodiment of the present invention, as shown in FIG. 4, the output of another substitution object area 12, which includes the defective cell x and also is located inside the edge portion of the core array, is determined to be replaced by the output of the redundant array RA, irrespective of the start address SA. In other words, when the first substitution object area 10 based on the start address SA protrudes to the outside of the core array, the output of the second substitution object area 12, which is independent of the start address, is replaced by the output of the redundant array RA. More specifically, the non-illustrated redundancy controller checks the substitution object address of the substitution address memory, and when the first substitution object area 10 including both sides of the defective cell extends to the outside of the core array, the redundancy controller disables the result of selecting either of the neighboring I/O blocks which was obtained from the comparison between the start address SA and the access address UA. As a result, even when the access address UA is smaller than the start address SA (UA<SA), an increment of the I/O block number is not carried out, but the entire output of the I/O block I/O15 is replaced by the output of the redundant array RA.

In the neighboring block I/O11 of the reference array RefA shown in FIG. 1, there occurs an identical condition to that shown in FIG. 4. Namely, when the first substitution object area 10 determined from the start address SA extends to the reference array RefA out of the edge portion of the I/O block I/O11, it becomes unable for the first substitution object area to be replaced correctly by the redundant array RA. Therefore, also in this case, the output of the second substitution object 12, which is entirely located in the core array, is replaced by the output of the redundant array RA.

Further, in case the last address of the substitution object area is used for recording the substitution object area into the substitution address memory, when the defective cell exists in the left edge portion of the I/O block I/O0 shown in FIG. 1, the first substitution object area 10 determined from the last address inevitably extends to the outside of the core array. Or, when the defective cell exists in the left edge portion of the I/O block I/O4, the first substitution object area 10 determined from the last address inevitably extends to the reference array RefA. Also in these cases, the output of the second substitution object area 12 in the core array is controlled to substitute the output of the redundant array RA, independently of the last address.

Figure 5:
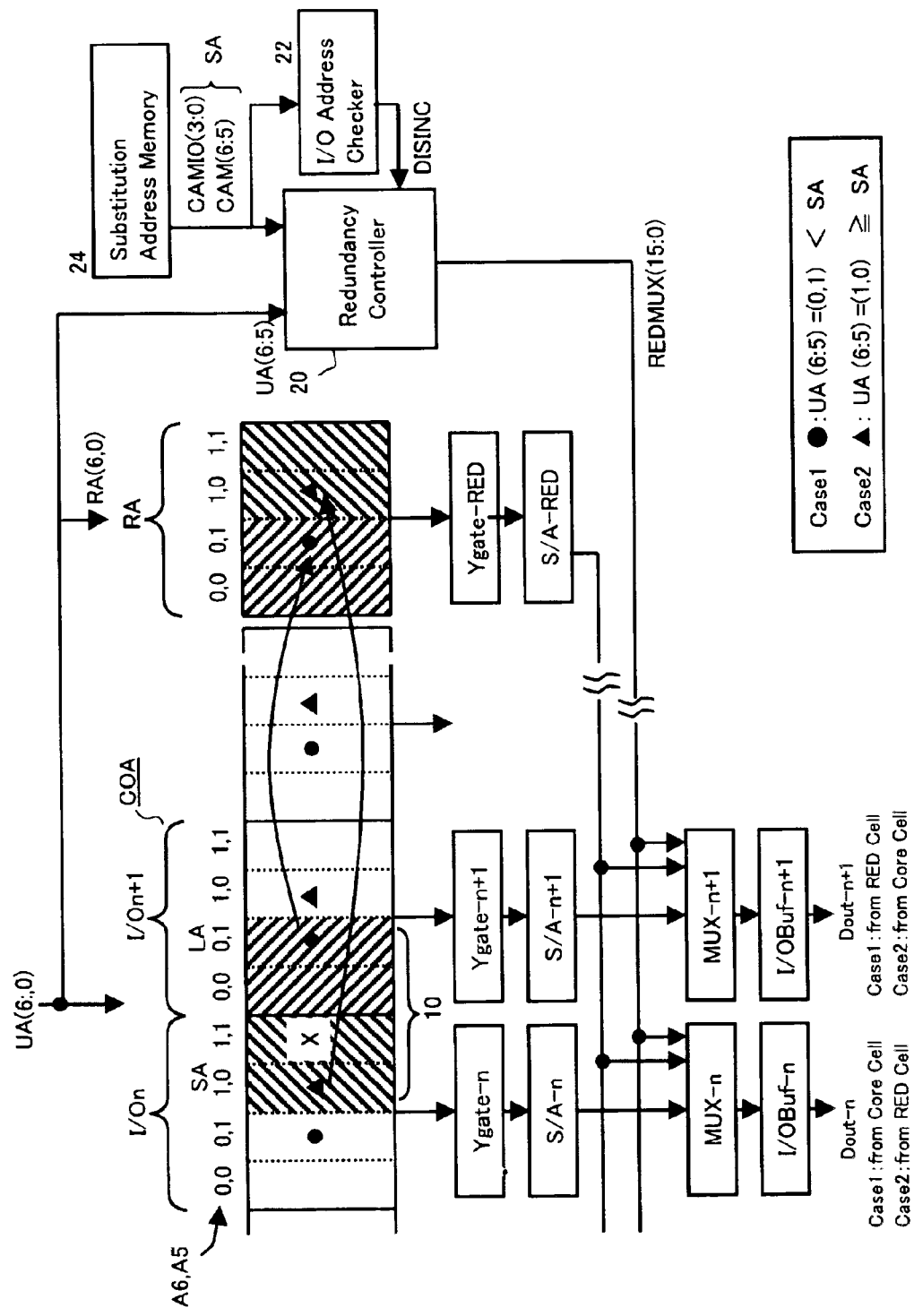
FIG. 5 shows a configuration diagram of the semiconductor memory according to the first embodiment of the present invention.

FIG. 5 shows a configuration diagram of the semiconductor memory in accordance with the first embodiment of the present invention. In this first embodiment, the redundant array RA is of the same size as each I/O block in the core array COA. The configuration of the core array COA is identical to FIG. 1, in which sixteen (16) I/O blocks are included in a sector, corresponding to 16 input/output terminals. Each I/O block is virtually divided into four (4) sub-blocks (A6, A5=0, 0 to 1, 1). Also, the redundant array RA which is of the same size as each I/O block is divided into 4 sub-blocks. This sub-block address is used for the start address SA and the last address LA which define substitution object area 10. Namely, the start address SA indicative of substitution object area 10 consists of CAM (6:5) and CAMIO (3:0), respectively specifying a particular sub-block in a particular I/O block, and is stored in substitution address memory 24 as the substitution object address.

In each I/O block, there are provided Y gates, referred to as Ygate-n and Ygate-n+1, for selecting a bit line in the I/O block according to a selection signal from a non-illustrated Y-decoder, and sense amplifiers S/A-n and S/A-n+1 for detecting the outputs of these Y gates. Similarly, in the redundant array RA, a Y gate Ygate-RED selecting a bit line in the redundant array and sense amplifier S/A-RED detecting the output of the Y gate Y-gate-RED. The outputs of 16 sense amplifiers S/A on the core array COA side and the output of one sense amplifier S/A-RED on the redundant array RA side are supplied to multiplexers MUX-n and MUX-n+1 which function as selection circuits. These multiplexers select an output from either the core array side or the redundant array side, depending on a substitution signal REDMUX supplied from redundancy controller 20, and feeds the selected output to an input/output buffer I/O-Buf. Or, in case of the write operation, the multiplexers select the write data from the input/output buffer I/O-Buf and outputs to either the core array side or the redundant array side depending on the substitution signal REDMUX.

An access address UA (6:0) supplied externally at the time of access is supplied to the Y decoder of the core array, and also supplied to the Y decoder of the redundant array as an address RA (6:0). Further, the upper two bits of the access address UA, UA (6:5) are supplied to redundancy controller 20.

When a defective cell is detected in the test process, both an I/O block address CAMIO (3:0) and a sub-block address CAM (6:5) in the I/O block at the left edge portion of substitution object area 10 are recorded in substitution address memory 24, as the start address SA of substitution object area 10 which includes both sides of the defective cell concerned. The sub-block address which is decremented by one from the sub-block including the defective cell is automatically set as the start address SA. In the example shown in FIG. 5, the defective cell x exists in a sub-block address (A6, A5=1, 1) in the I/O block I/On. Therefore, as the start address SA, there is set a sub-block address (A6, A5=1, 0) in the I/O block I/On, which is smaller by one than the sub-block address of the defective cell. Thus, with regard to the defective cell x shown in FIG. 5, the I/O block address [CAMIO (3:0)=n] and the sub-block address [CAM (6:5)=1, 0] respectively specifying substitution object area 10 are stored in substitution address memory 24 as the start address SA.

In the example shown in FIG. 5, because the defective cell x is located in the sub-block (1, 1) of the I/O block I/On, substitution object area 10 determined by the start address SA includes both the neighboring I/O blocks I/On and I/On+1. Accordingly, redundancy controller 20 compares the access address UA (6:5) with the sub-block address CAM (6:5) which constitutes a portion of the start address SA stored in substitution address memory 24, and if the access address UA (6:5) is not smaller than the sub-block address CAM (6:5) (SA=<UA), redundancy controller 20 sets a substitution signal REDMUX(n) corresponding to the I/O block address [CAMIO (3:0)=n] stored in substitution address memory 24 to the 'H' level, and controls the multiplexer MUX to substitute the output of the redundant array RA for the output of the I/O block I/On. This case corresponds to the case-2 shown in the figure, in which an access is made to a cell depicted with a triangle in the sub-block (1, 0). In this case, the output of the sub-block (1, 0) in the redundant array RA is substituted for the output of the sub-block (1, 0) in the I/O block I/On.

Meanwhile, if the access address UA (6:5) is smaller than the sub-block address CAM (6:5) of the start address SA (UA<SA), redundancy controller 20 sets to the 'H' level the substitution signal REDMUX (n+1) corresponding to the address n+1, which is incremented by one from the I/O block address [CAMIO (3:0)=n] in the substitution address memory 24, and controls the multiplexer MUX to substitute the output of the redundant array RA for the output of the I/O block I/On+1. This case corresponds to the case-1 shown in the figure, in which an access is made to a cell depicted with a black circle in the sub-block (0, 1).

Figure 6:
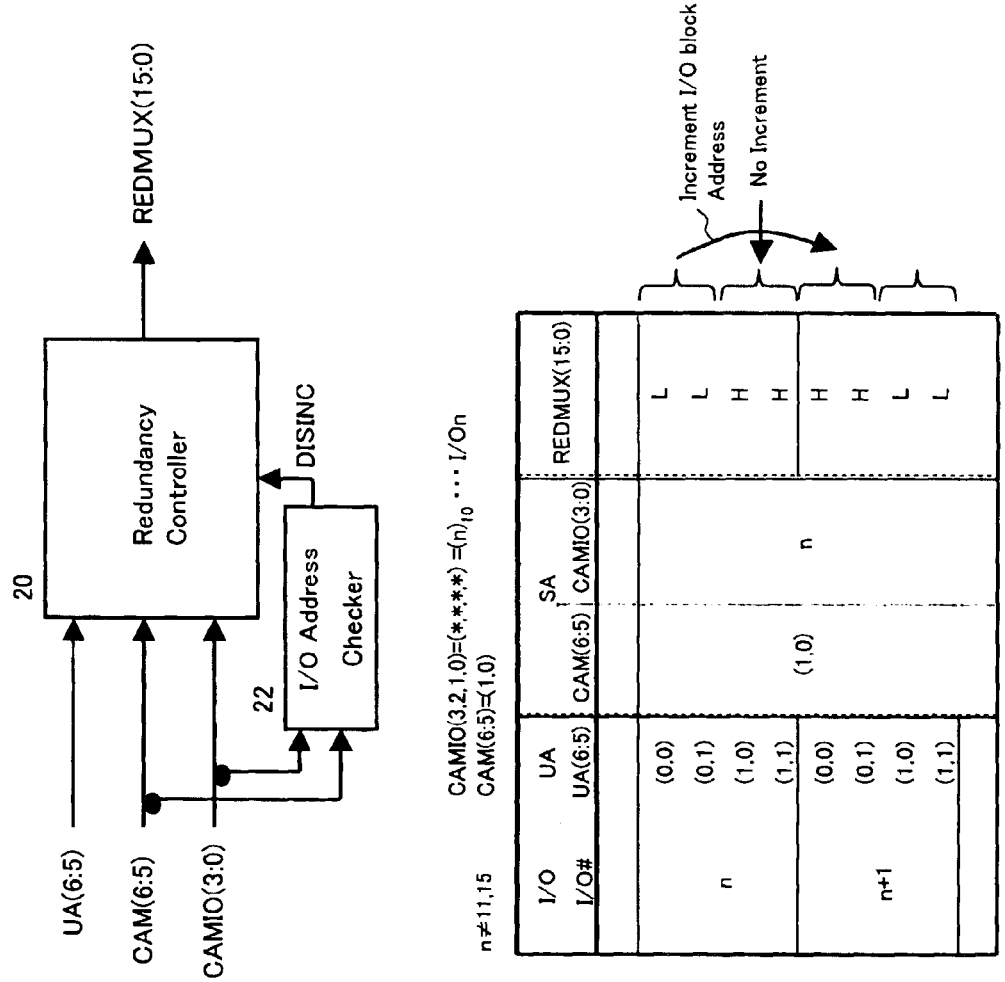
FIG. 6 shows a diagram illustrating the logical value table for a redundancy controller operation.

FIG. 6 shows the logical value table for the redundancy controller operation. The start address SA of substitution object area 10 is a sub-address which is smaller by one than the sub-block of the defective cell x. In the example shown in FIG. 5, the start address SA is [CAMIO (3, 2, 1, 0)=n] (based on the decimal system), and [CAM (6:5)=(1, 0)]. From the comparison result between the sub-address [CAM (6:5)=(1, 0)] of the start address SA and the access address UA (6:5), if CAM (6:5)=<UA (6:5), that is, if the access address UA (6:5)=(1, 0) or (1, 1), the substitution signal REDMUX (n) corresponding to the address [CAMIO (3, 2, 1, 0)=n] is set to the 'H' level. As a result, the output of the I/O block I/On is replaced by the output of the redundant array RA. Meanwhile, if UA (6:5)<CAM (6:5), that is, if the access address UA (6:5)=(0, 0) or (0, 1), the substitution signal REDMUX (n+1) corresponding to the address n+1, which is incremented by one from the address [CAMIO (3, 2, 1, 0)=n], is set to the 'H' level. As a result, the output of the I/O block I/On+1 is replaced by the output of the redundant array RA. In other words, increment of the I/O block address is performed in this case.

An I/O address checker 22 shown in FIG. 6 checks whether or not the substitution object area specified by the substitution object address extends to the outside of the edge portion of the core array. This is performed by checking whether the I/O block address CAMIO (3:0) of the substitution object address is either I/O11 or I/O15 located in the edge portion of the core array and by checking whether the in-block address CAM (6:5) is any of (0, 1), (1, 0) and (1, 1). If the substitution object area is determined to extend to the outside of the edge portion of the core array, I/O address checker 22 outputs a disable increment signal DISINC, so that the I/O increment by redundancy controller 20 is disabled. In such a way, in the example shown in FIG. 5, because the first substitution object area 10 including both sides of the defective cell x entirely exists in the core array, I/O address checker 22 does not output the disable increment signal DISINC.

Figure 7:
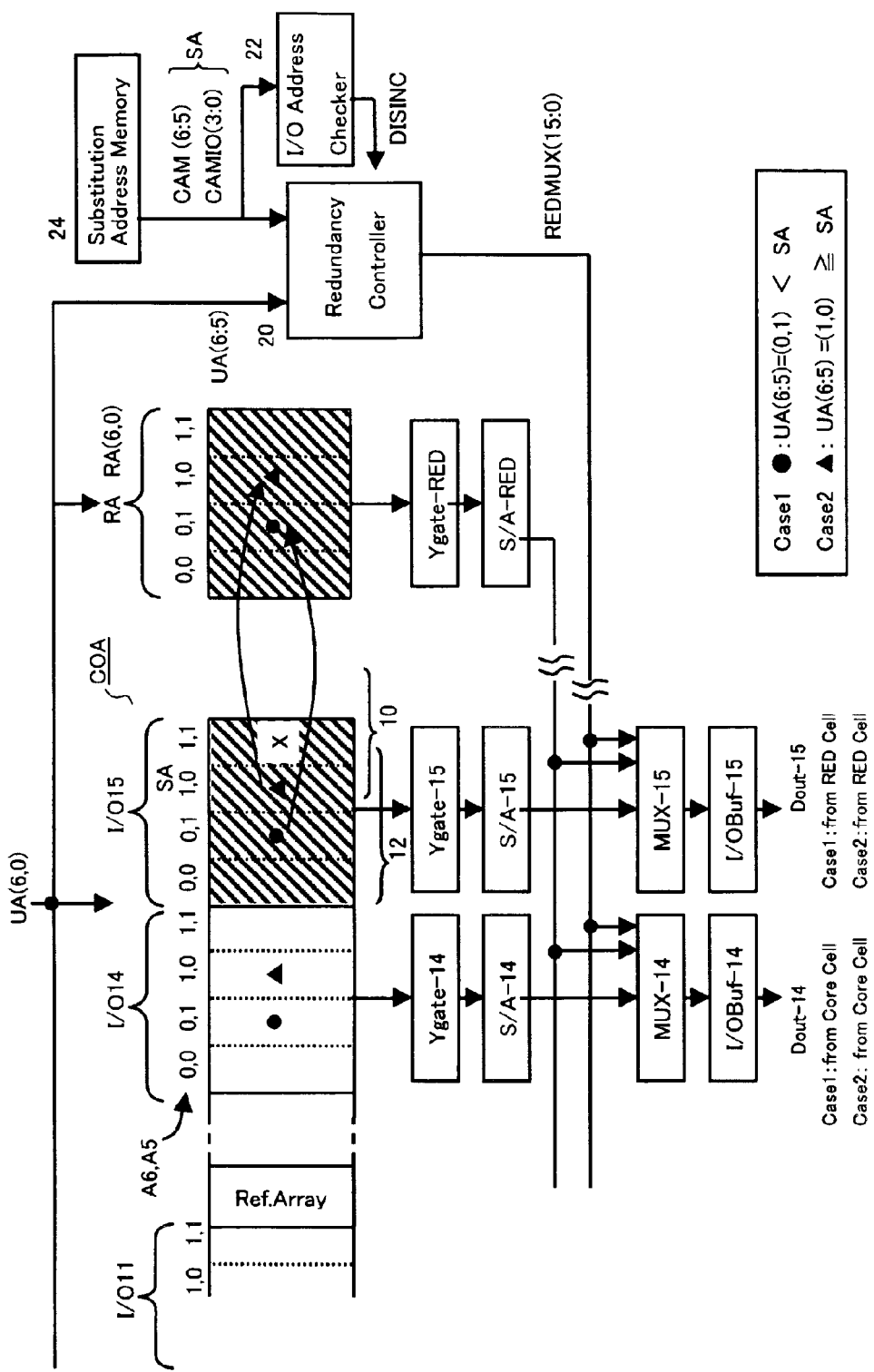
FIG. 7 shows a configuration diagram of the semiconductor memory in accordance with the first embodiment of the present invention.

FIG. 7 is a configuration of the semiconductor memory in accordance with the first embodiment of the present invention. This configuration is identical to the configuration shown in FIG. 5. However, in the example shown in FIG. 7, a defective cell x exists in the sub-block (A6, A5=1, 1) located in the right edge portion of the core array COA. From this location of the defective cell, the start address SA which specifies the first substitution object area 10 is set as [CAMIO (3:0)=I/O15] and [CAM (6:5)=(1, 1)]. Therefore, the first substitution object area 10 specified by this start address SA extends to the outside of the right edge portion of the core array COA. In such a case, in response to the disable increment signal DISINC supplied from I/O address checker 22, redundancy controller 20 is inhibited from selecting the neighboring I/O blocks through the comparison between the sub-block address CAM (6:5) and the access address UA (6:5). Instead of performing the above-mentioned I/O increment, redundancy controller 20 constantly holds the substitution signal REDMUX (15) to the 'H' level, so that the entire output of the I/O block I/O15 is replaced by the output of the redundant array RA. Namely, redundancy controller 20 substitutes the output of the redundant array RA for the output of the second substitution object area 12 which is entirely located in the core array, irrespective of the sub-block address CAM (6:5) stored in substitution address memory 24 which specifies the first substitution object area 10.

In FIG. 7, the I/O increment is not performed irrespective of whether the defective cell is located at the position shown with a black circle in the sub-block (0, 1) (i.e. case 1), or the defective cell is located at the position shown with a triangle in the sub-block (1, 0) (i.e. case 2). The output of the I/O block I/O15 is replaced by the output of the redundant array RA.

Figure 8:
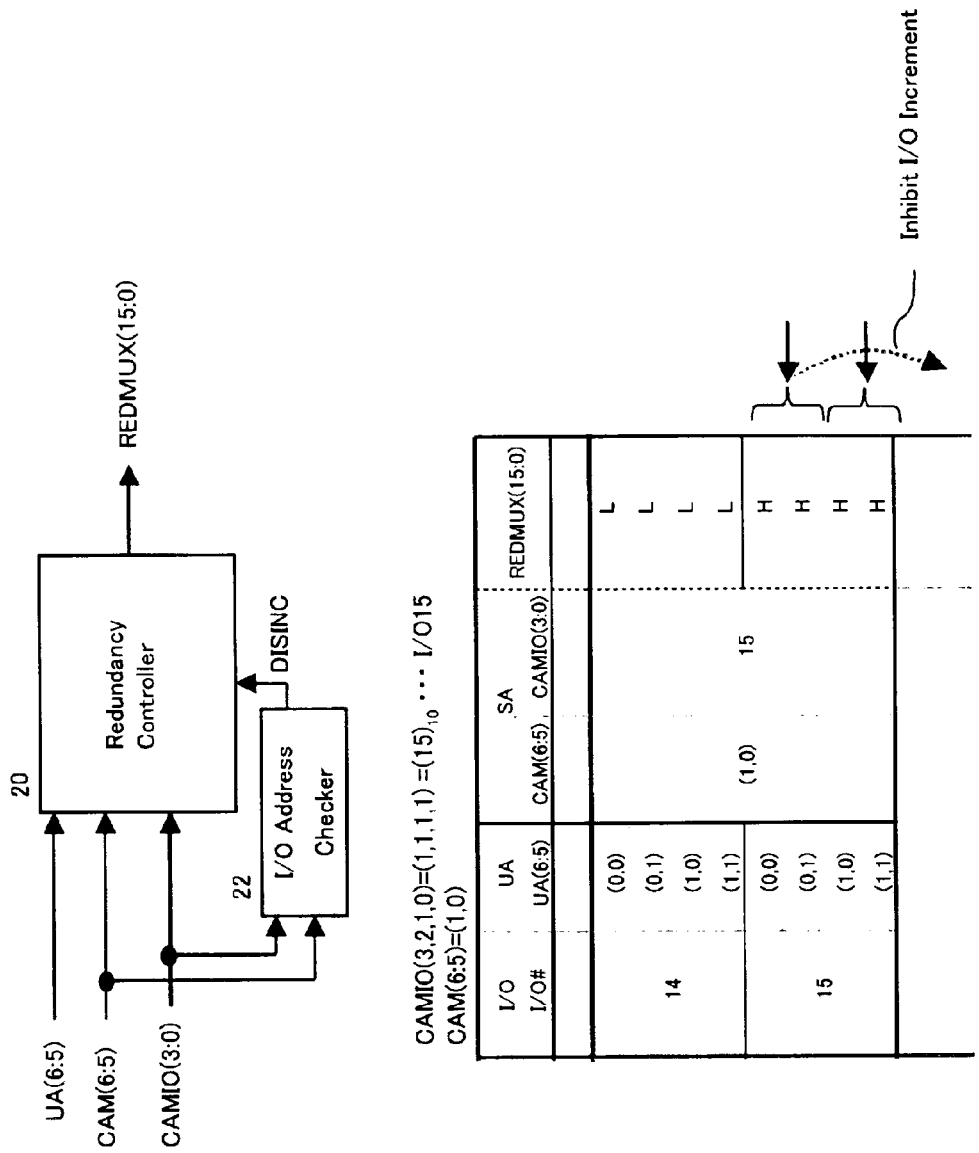
FIG. 8 shows a diagram illustrating the logical value table for the redundancy controller operation.

FIG. 8 shows the truth value table for the redundancy controller operation, in case the defective cell is located in the position shown in FIG. 7. On detecting that the defective cell is located in the edge portion of the core array and that the first substitution object area 10 specified by the start address SA protrudes from the core array, I/O address checker 22 sets the disable increment signal DISINC to the 'H' level. As a result, redundancy controller 20 is inhibited from performing the I/O increment based on the comparison between the sub-block address CAM (6:5) of the start address SA and the access address UA (6:5), and substitutes the output of the redundant array RA for the output of the second substitution object area 12 corresponding to the I/O address I/O15 stored in the substitution address memory 24.

Figure 9:
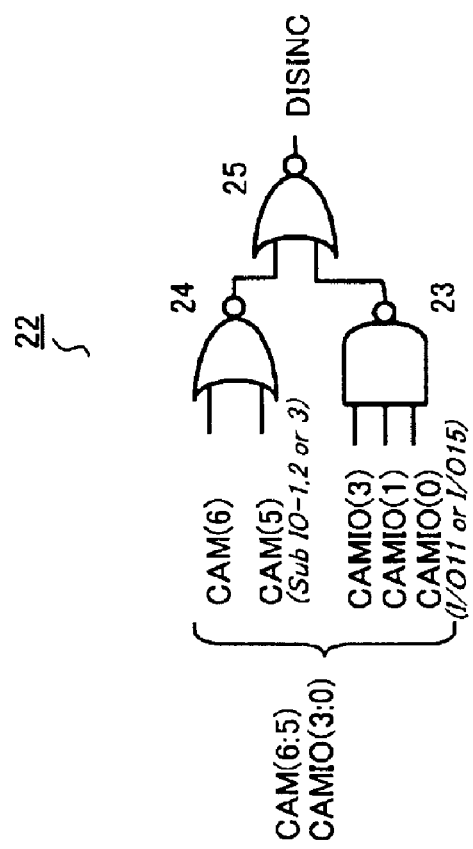
FIG. 9 shows a logic circuit diagram of an I/O address checker in accordance with the first embodiment of the present invention.

FIG. 9 shows a logic circuit diagram of the I/O address checker in accordance with the first embodiment of the present invention. I/O address checker checks whether or not the first substitution object area 10 specified by the start address SA including CAMIO (3:0) and CAM (6:5) extends to the outside of the core array. More specifically, a NAND gate 23 inputs the I/O block address CAMIO (3) (1) (0) and is set to the 'L' level in case of I/O11 (=1011) or I/O15 (=1111). A NOR gate 24 inputs the sub-block address CAM (6) (5) and is set to the 'L' level when the sub-address is any of (0, 1), (1, 0) and (1, 1). When the both NAND gate 23 and NOR gate 24 output the 'L' level, a NOR gate 25 outputs the H-level disable increment signal DISINC.

Figure 10:
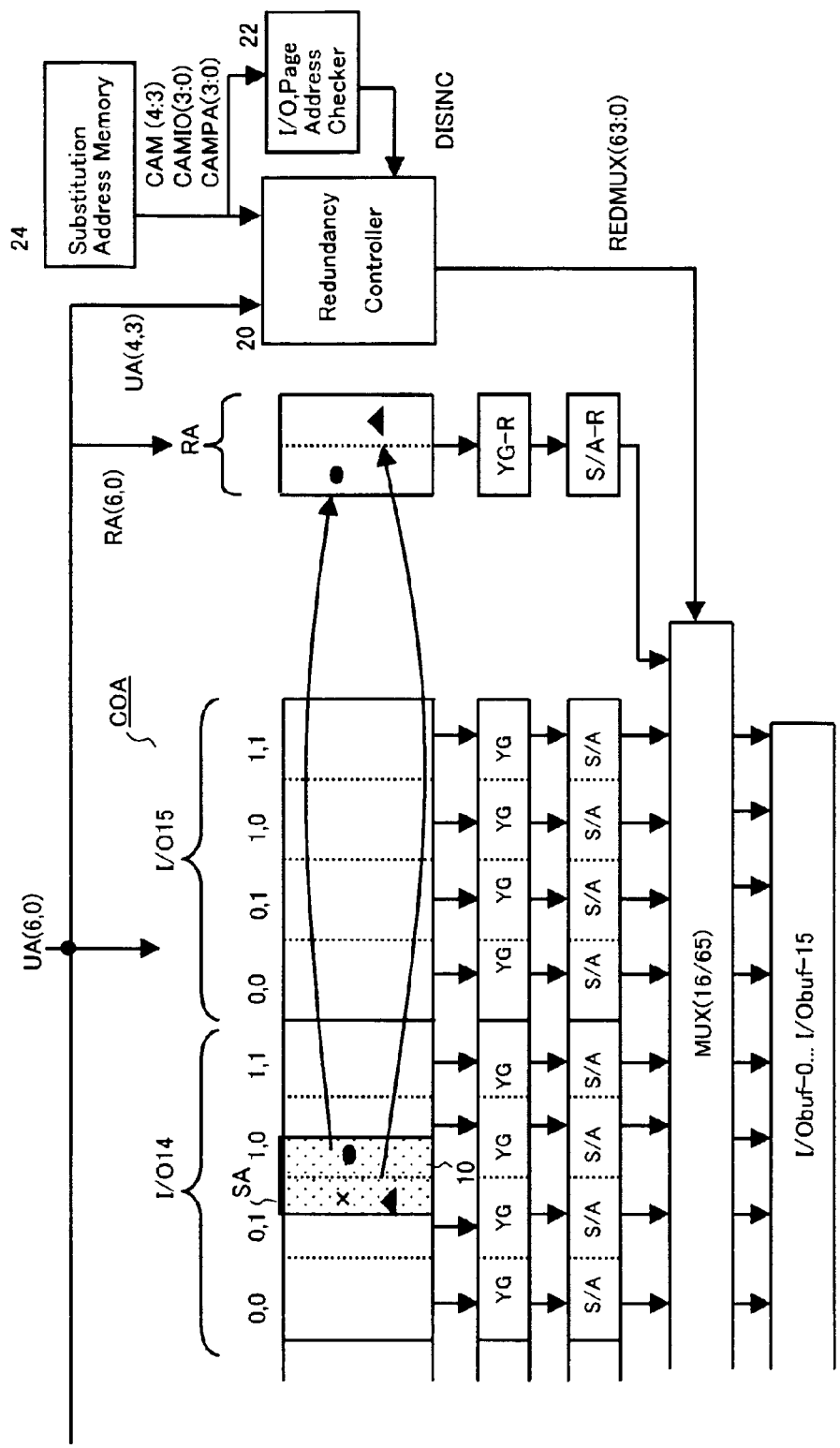
FIG. 10 shows a configuration diagram of the semiconductor memory in accordance with a second embodiment of the present invention.

FIG. 10 shows a configuration of the semiconductor memory in accordance with the second embodiment of the present invention. In this second embodiment, a non-illustrated sector in the core array COA has 16 I/O blocks I/O0-I/O15, each having 4 sub-blocks or pages (0, 0–1, 1). The redundant array RA is of the same size as each page. Accordingly, the start address specifying the first substitution object area 10 including both sides of the defective cell is constituted of I/O block address CAMIO (3:0), page address CAMPA (3:0) and in-page address CAM (4:3). Here, the page address CAMPA (3:0) consists of four bits, instead of two bits, and each four-bit data corresponds to each of the four pages.

Each page of the core array COA is connected to a sense amplifier S/A through a Y gate YG, and a page output is appropriately replaced by the output of the redundant array RA by means of a redundancy substitution circuit MUX. This substitution control is performed based on 64 redundancy substitution signals REDMUX (63:0) supplied from redundancy controller 20. More specifically, the redundancy substitution circuit MUX selects 16 outputs out of 64 outputs of the sense amplifiers S/A provided on the core array COA side, and one output of the sense amplifier S/A provided on the redundant array RA side, and feeds the selected outputs to 16 input/output buffers I/Obuf-0-I/Obuf-15.

Also in this second embodiment of the present invention, the moving window scheme is employed, in which the substitution object area is shifted depending on the location of the defective cell so as to include both sides of the defective cell. Because the redundant array RA is of the same size as each page, substitution object area 10 may possibly be extended over neighboring pages. In the example shown in FIG. 10, substitution object area 10 extends to both neighboring pages (0, 1) and (1, 0) in the I/O block I/O14. Accordingly, redundancy controller 20 compares the access address UA (4:3) with the in-page address CAM (4:3) in the start address stored in substitution address memory 24 to select either one of the neighboring pages in a similar manner to the first embodiment. Redundancy controller 20 then sets the substitution signal REDMUX corresponding to the selected page to the 'H' level, so as to control to replace of the page output by the output of the redundant array RA. In other words, redundancy controller 20 increments the page address CAMPA (3:0) when the access is made to the cell marked with the black circle.

Figure 11:
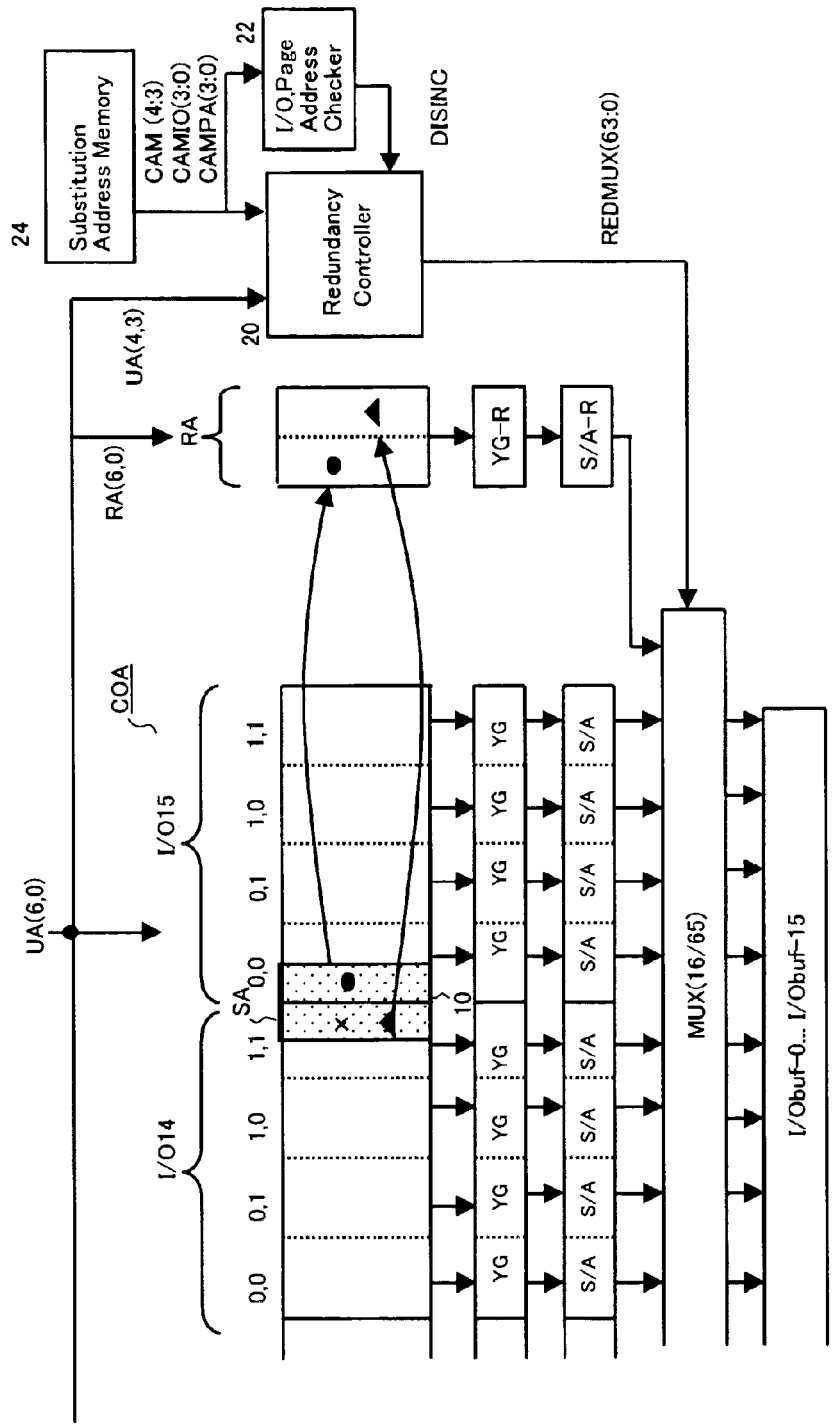
FIG. 11 shows a configuration diagram of the semiconductor memory in accordance with the second embodiment of the present invention.

FIG. 11 shows a configuration of the semiconductor memory in accordance with the second embodiment of the present invention. In the example shown in FIG. 11, the defective cell x is located in the upper address area of the page (1, 1) of the I/O block I/O14. As a result, the first substitution object area 10 being set so that the defective cell x concerned is to be centered is extended over both the neighboring I/O blocks I/O14 and I/O15, and further extended over both the page (1, 1) in the I/O block I/O14 and the neighboring page (0, 0) in the I/O block I/O15. In such a case, redundancy controller 20 compares the in-page address CAM (4:3) with the access address UA (4:3) to detect to which page the access is being made, and also to which I/O block the access is being made. For example, when the access is made to the cell positioned on the black circle in the figure, redundancy controller 20 increments the page address [CAMPA (3)=(1, 1)] stored in substitution address memory 24, to the page address [CAMPA (0)=(0, 0)], increments the I/O block address [CAMIO (3:0)=I/O14], to the I/O block address [CAMIO (3:0)=I/O15], and sets the corresponding redundancy substitution signal REDMUX to the 'H' level.

Figure 12:
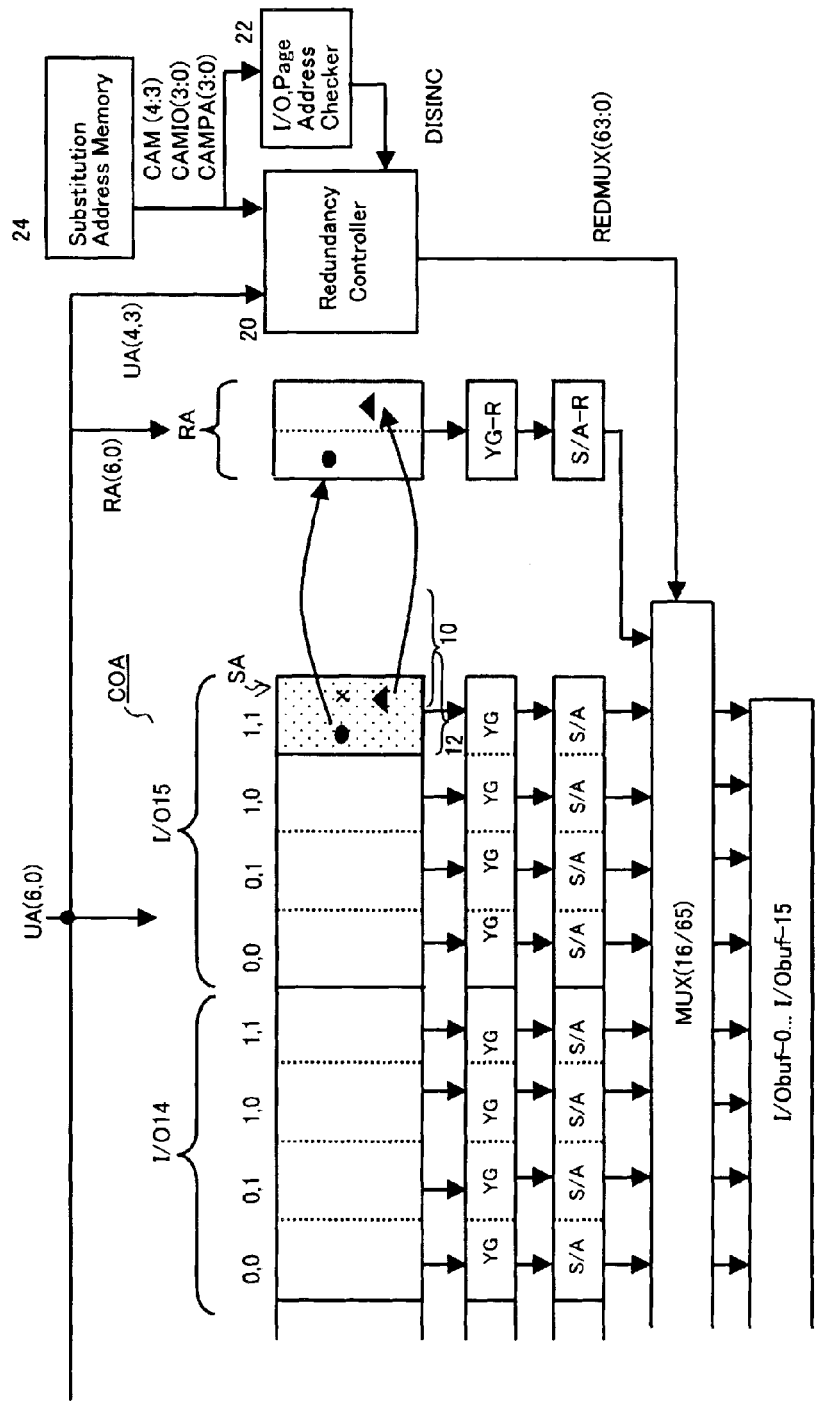
FIG. 12 shows a configuration diagram of the semiconductor memory in accordance with the second embodiment of the present invention.

FIG. 12 shows the configuration diagram of the semiconductor memory in accordance with the second embodiment of the present invention. In this example shown in FIG. 12, the defective cell x is positioned in the right edge portion of the I/O block I/O15. In this case, a portion of the first substitution object area 10 determined from the start address SA extends to the outside of the core array COA. Accordingly, redundancy controller 20 controls to substitute the output of the redundant array RA for the output of the second substitution object area 12, which includes the defective cell and is entirely located on the inside of the core array, in place of the output of the first substitution object area 10 determined from the start address SA.

For this purpose, I/O page address checker 22 checks the start address stored in substitution address memory 24 to determine whether or not the first substitution object area 10 specified by the start address protrudes from the core array. On detection of the first substitution object area 10 protruding from the core array, I/O page address checker 22 generates the disable increment signal DISINC. Thus, the increment of both the page address and the I/O block address by redundancy controller 20 is inhibited. As a result, the entire output of the page (1, 1) in the I/O block I/O15 is replaced by the output of the redundant array RA.

Figure 13:
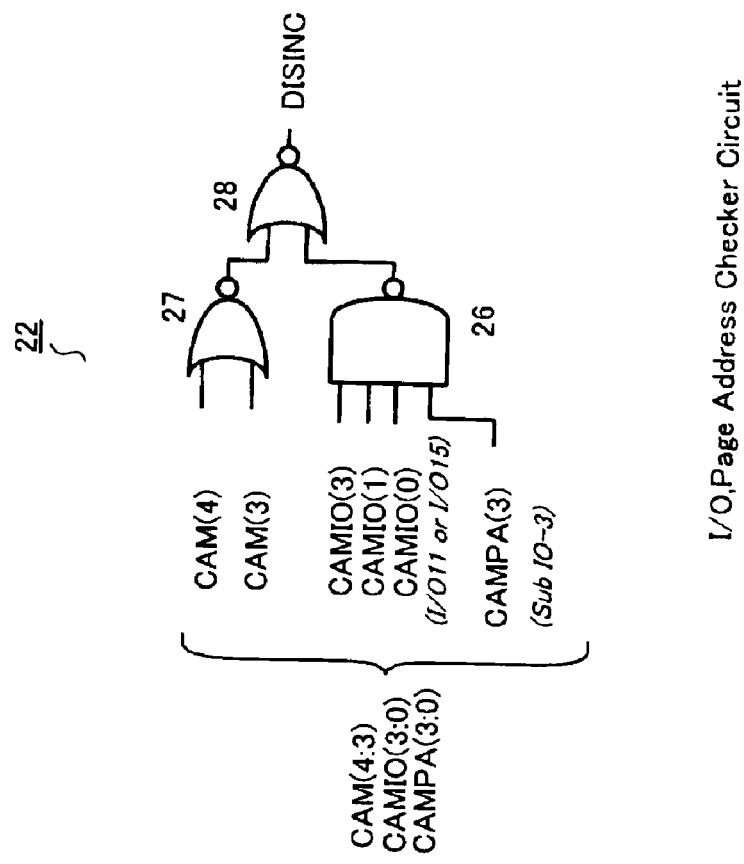
FIG. 13 shows a logic circuit diagram of an I/O page address checker in accordance with the second embodiment of the present invention.

FIG. 13 is a logic circuit diagram of the I/O page address checker in accordance with the second embodiment of the present invention. The difference from the I/O page address checker shown in FIG. 9 is that the page address CAMPA (3) is input to a NAND gate 26, and that the in-page address CAM (4) (3) is input to a NOR gate 27. The rest of the circuit is the same as that shown in FIG. 9. Accordingly, when the start address includes the address [CAM (4:3)=(1, 1)] in the page (1, 1) of either I/O block I/O11 or I/O15, this address checker 22 detects that the first substitution object area 10 extends to the outside of the core array, and controls redundancy controller 20 to inhibit both the I/O block increment and the page increment by setting the disable increment signal DISINC to the 'H' level.

In the above-mentioned embodiment of the present invention, redundancy controller 20 compares the start address with the access address to determine the substitution object block or page, and inhibits this determination in response to the disable signal supplied from I/O page address checker 22. However, it may also be possible that redundancy controller 20 is so configured as to incorporate this I/O page address checker by use of a certain logic circuit. This logic circuit controls; (1) to determine a substitution object block or page depending on the access address when the first substitution object area specified by the start address extends to the neighboring blocks or the neighboring pages inside the core array, and replace the corresponding output of the first substitution object area by the redundant array output; and (2) when the first substitution object area extends to the outside of the core array, to determine the second substitution object area which includes the defective cell and is located inside the core array, and replace the output of the second substitution object area by the redundant array output.

In the foregoing description of the embodiment, the flash memory having the virtual bit line configuration has been taken as an example. However, the embodiment of the present invention is not limited to the flash memory, but can also be applied to other memories, as long as in such a memory there is adopted a scheme of registering the areas located on both sides of a defective cell as the substitution object area. According to the embodiment of the present invention, when the substitution object area extends to the outside of the core array, another substitution object area to be located on the inside of the core array is selected, and the output thereof is replaced by the redundant array output.

Also, according to the foregoing description, the start address of the first substitution object area is stored in the substitution address memory. However, it may be possible to store either the end address of the first substitution object area, or the center address of the first substitution object area. In addition, the redundant array is not necessarily of the same size as each I/O block or sub-I/O block (page).

To summarize, the present invention can provide a semiconductor memory in which a redundant array output can be correctly substituted for an output of the area including a defective cell.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A semiconductor memory comprising:
   a core array including a plurality of memory cells;
   a redundant array to be substituted for a substitution object area including a defective cell in the core array;
   a substitution address memory storing an address of a first substitution object area including both sides of the defective cell as a substitution object address; and
   a redundancy controller controlling to substitute the redundant array for the core array,
   wherein, when the first substitution object area is entirely located on the inside of the core array, said redundancy controller controls to substitute the redundant array for said first substitution object area corresponding to the substitution object address, and when a portion of the first substitution object area is located on the outside of the core array, the redundancy controller controls to substitute the redundant array for a second substitution object area which includes the defective cell and is located on the inside of the core array, irrespective of the substitution object address.

2. The semiconductor memory according to claim 1, wherein the redundancy controller compares an access address supplied at a time of access with the substitution object address, and the first substitution object area is replaced by the redundant array according to the comparison result.

3. The semiconductor memory according to claim 1, wherein the core array comprises a plurality of blocks, and the substitution object address includes a block address and an in-block address, and
   when the first substitution object area extends to the neighboring blocks, the redundancy controller substitutes the redundant array for either one of the neighboring blocks, depending on the comparison result between an access address supplied at a time of access and the in-block address.

4. The semiconductor memory according to claim 1, wherein the core array comprises a plurality of blocks and each of the plurality of blocks comprises a plurality of sub-blocks, and the substitution object address includes a block address, a sub-block address and an address in the sub-block, and
   when the first substitution object area extends to the neighboring sub-blocks, the redundancy controller substitutes the redundant array for either one of the blocks of the neighboring sub-blocks, depending on the comparison result between an access address and the address in the sub-block.

5. A semiconductor memory comprising:
   a core array including a plurality of blocks each having a plurality of memory cells;
   a redundant array to be substituted for a substitution object area including a defective cell in the core array;
   a substitution address memory storing an address of a first substitution object area including both sides of the defective cell as a substitution object address; and
   a redundancy controller controlling to substitute the redundant array for the core array depending on said substitution object address,
   wherein, when the first substitution object area is entirely located on the inside of the core array, and extends to both neighboring blocks, the redundancy controller selects either one of said neighboring blocks depending on an access address so as to substitute the redundant array for said selected block, and
   when a portion of the first substitution object area is located on the outside of the core array, the redundancy controller controls to substitute the redundant array for a second substitution object area which includes the defective cell and is located on the inside of the core array.

6. The semiconductor memory according to claim 5,
   wherein the redundant array is of the same size as each block,
   the substitution object address includes a block address and an in-block address of the block which are indicative of the first substitution object area, and
   the redundancy controller selects either one of the neighboring blocks by comparing the access address with the in-block address.

7. The semiconductor memory according to claim 5,
   wherein each block in the core array further comprises a plurality of sub-blocks,
   the redundant array is of the same size as each sub-block,
   the substitution object address includes a block address, a sub-block address of the sub-block, and an address in the sub-block of the block which are indicative of the first substitution object area, and
   the redundancy controller selects either one of the neighboring blocks by comparing the access address with the address in the sub-block.

8. The semiconductor memory according to claim 7,
   wherein when the first substitution object area extends to the neighboring sub-blocks, the redundancy controller selects either one of said neighboring sub-blocks depending on the access address, and controls to substitute the redundant array for said selected sub-block.

9. The semiconductor memory according to claim 5,
   wherein each of the plurality of blocks is provided corresponding to each output terminal, and
   when the first substitution object area is entirely located on the inside of the core array and extends to both neighboring blocks, the redundancy controller controls to substitute an output of the redundant array for an output of either one of the neighboring blocks depending on the access address, and
   when a portion of the first substitution object area is located on the outside of the core array, the redundancy controller controls to substitute the output of the redundant array for an output of the second substitution object area.

10. The semiconductor memory according to claim 5,
    wherein the memory cell comprises a cell transistor having a trap gate for storing charge, and the neighboring cell transistors are connected to a common bit line.

11. The semiconductor memory according to claim 5 further comprising a reference array sandwiched between the blocks,
    wherein when a portion of the first substitution object area is located in the reference array positioned on the outside of the core array, the redundancy controller controls to substitute the redundant array for the second substitution object area.

12. The semiconductor memory according to claim 5,
wherein the substitution object address includes a start address of the first substitution object area, and
when the first substitution object area includes an outer address than the uppermost address of the core array, the redundancy controller controls to substitute the redundant array for the second substitution object area.

13. The semiconductor memory according to claim 5,
wherein the substitution object address includes an end address of the first substitution object area, and
when the first substitution object area includes an outer address than the lowermost address of the core array, the redundancy controller controls to substitute the redundant array for the second substitution object area.

* * * * *